United States Patent
Champlin

(10) Patent No.: US 6,737,831 B2
(45) Date of Patent: May 18, 2004

(54) METHOD AND APPARATUS USING A CIRCUIT MODEL TO EVALUATE CELL/BATTERY PARAMETERS

(76) Inventor: Keith S. Champlin, 5437 Elliot Ave. South, Minneapolis, MN (US) 55417

(*) Notice: Subject to any disclaimer, the term of this patent is extended or adjusted under 35 U.S.C. 154(b) by 152 days.

(21) Appl. No.: 10/073,378

(22) Filed: Feb. 8, 2002

(65) Prior Publication Data

US 2002/0109504 A1 Aug. 15, 2002

Related U.S. Application Data

(60) Continuation-in-part of application No. 09/940,684, filed on Aug. 27, 2001, now Pat. No. 6,495,990, which is a division of application No. 09/388,501, filed on Sep. 1, 1999, now Pat. No. 6,313,607.
(60) Provisional application No. 60/299,876, filed on Jun. 21, 2001.

(51) Int. Cl.⁷ .................................................. H02J 7/00
(52) U.S. Cl. ........................................ 320/132; 320/130
(58) Field of Search ................................ 320/132, 130, 320/134; 324/430, 436

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |

(List continued on next page.)

OTHER PUBLICATIONS

National Semiconductor Corporation, "High Q Notch Filter", 3/69, Linear Brief 5, Mar. 1969.

(List continued on next page.)

*Primary Examiner*—Lawrence Luk
(74) *Attorney, Agent, or Firm*—Westman, Champlin & Kelly, P.A.

(57) ABSTRACT

Testing apparatus senses the time-varying electrical response of an electrochemical cell/battery to time-varying electrical excitation. The cell/battery may, or may not, be in service. Computation circuitry responsive to the time-varying electrical response evaluates elements of a unique circuit model representation of the cell/battery. Performance parameters and physical parameters are computed from these element values. Computed performance parameters include, but are not limited to, "total storage capacity", "absolute stored charge", "state-of-charge", "absolute cranking current", "fully charged cranking current", and "state-of-health". Computed physical parameters include, but are not limited to, "exchange current", "maximum exchange current", "charge transfer conductance", "maximum charge transfer conductance", "double layer capacitance", and "maximum double layer capacitance". Computed parameters are either displayed to the user, employed to initiate an alarm, or used to control a process such as charging the cell/battery.

143 Claims, 3 Drawing Sheets

U.S. PATENT DOCUMENTS

| | | | |
|---|---|---|---|
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,697,134 A | 9/1987 | Burkum et al. | 324/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Kuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A | 11/1996 | McShane et al. | 320/39 |

| Patent No. | Date | Inventor | Class |
|---|---|---|---|
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.8 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 * | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,495,990 B2 * | 12/2002 | Champlin | 320/132 |

FOREIGN PATENT DOCUMENTS

| | | |
|---|---|---|
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

Burr–Brown Corporation, "Design A 60 Hz Notch Filter with the UAF42", 1/94, AB–071, 1994.

National Semiconductor Corporation, "LMF90–4$^{th}$–Order Elliptic Notch Filter", 12/94; RRD–B30M115, Dec. 1994.

"Alligator Clips with Wire Penetrators" *J. S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

* cited by examiner

“METHOD AND APPARATUS USING A CIRCUIT MODEL TO EVALUATE CELL/BATTERY PARAMETERS”

This is a Continuation-In-Part of patent application Ser. No. 09/940,684 filed Aug. 27, 2001, now U.S. Pat. No. 6,495,990, which is a Divisional of patent application Ser. No. 09/388,501 filed Sep. 1, 1999, which issued as U.S. Pat. No. 6,313,607 on Nov. 6, 2001 and also claims priority to U.S. provisional application Ser. No. 60/299,876 filed Jun. 21, 2001, the contents of which are hereby incorporated by reference in their entirety.

BACKGROUND OF THE INVENTION

"Total storage capacity" (TSC), "absolute stored charge" (ASC), "state-of-charge" (SOC), "absolute cranking current" (ACC), "fully charged cranking current" (FCCC) and "state-of-health" (SOH) are important performance parameters of an electrochemical cell/battery. These six parameters are assumed herein to have the following definitions:

"Total storage capacity" (TSC) denotes the total amount of charge that a fully charged battery can supply under specified discharge conditions. TSC is usually expressed in ampere-hours or in reserve capacity minutes.

"Absolute stored charge" (ASC)—also expressed in ampere-hours or reserve capacity minutes—denotes the amount of charge that a battery can supply in its current charge state. As a battery is discharged, its ASC decreases—much like the level of liquid in a fuel tank.

"State-of-charge" (SOC), or "relative stored charge", is the ratio of a battery's ASC to its TSC—generally expressed as a percentage. A battery's SOC indicates whether charging is advisable and identifies the point at which charging should be discontinued.

"Absolute cranking current" (ACC) denotes the high-rate discharge current in amperes that a battery can sustain at a specified voltage for a specified time in its present charge state. As a battery discharges, its ACC decreases.

"Fully charged cranking current" (FCCC) denotes the value that the ACC would assume if the battery were fully charged.

"State-of-health" (SOH) describes a battery's full charge capability, either its TSC or its FCCC, vis-à-vis its rated specifications. SOH identifies the point at which battery replacement is advisable.

Both ASC and TSC have traditionally been measured by performing timed-discharge tests on batteries that are partially or fully charged, respectively. Because of the time and expense involved in performing complete discharge tests, other techniques for determining ASC and TSC have been proposed. In U.S. Pat. No. 6,255,801, Chalasani claims to determine battery capacity from observations of the coup de fouet effect. O'Sullivan, in U.S. Pat. No. 6,211,654, discloses a method for predicting battery capacity from the discharge characteristics over a relatively short time period at the beginning of a full discharge.

Techniques employing time-varying signals have also been proposed. Sharaf, in U.S. Pat. No. 3,808,522, purportedly determines the ampere-hour capacity of a lead-acid battery from ac measurements of its internal resistance. Yang, in U.S. Pat. No. 5,126,675, also uses single-frequency internal resistance measurements to predict battery capacity. Muramatsu reports in U.S. Pat. No. 4,678,998 that he can determine both the remaining amp-hour capacity and the remaining service life of a battery from measurements of the magnitude of the ac impedance at two different frequencies. Fang, in U.S. Pat. No. 5,241,275, teaches a method for determining remaining capacity from complex impedance measured at two or three frequencies in the range from 0.001 to 1.0 Hz. Hampson, et al., in U.K. Patent Application GB 2,175,700A, report determining battery capacity from the frequency of the maximum value of capacitive reactance in the "impedance characteristic curve". Yoon et al., in U.S. Pat. Nos. 6,208,147 and 6,160,382, claim that a battery's capacity can be found by analyzing the complete impedance spectrum over a wide frequency range. Presumably, any of these techniques, if effective, could also be used to determine SOH by comparing the TSC thus determined with a rated value.

Champlin, in U.S. Pat. No. 5,140,269, shows that the percent capacity of a standby battery—and hence its SOH—can be determined from its ac conductance measured at a single frequency if the ac conductance of a reference, fully charged, identically constructed, new battery is known. This method, although quite effective, requires that such ac conductance data be available, apriori.

"Absolute cranking current" (ACC) and "fully charged cranking current" (FCCC) have been traditionally measured with timed, high-rate, discharge tests. Such tests have many disadvantages, however. They require heavy and cumbersome equipment, cause dangerous sparking, give imprecise results, and leave the battery in a significantly worse condition than existed before the test was performed. In response to the need for a better method, Champlin pioneered a testing technique based upon single-frequency ac conductance measurements. Various aspects of this well-accepted methodology have been disclosed in U.S. Pat. Nos. 3,873,911, 3,909,708, 4,816,768, 4,825,170, 4,881,038, 4,912,416, 5,572,136, 5,585,728, 5,598,098, and 5,821,756.

With lead-acid batteries, SOC has been traditionally evaluated by observing the battery's open-circuit voltage or the specific gravity of its electrolyte. However, neither of these quantities provides information about the battery's TSC, ASC, ACC, FCCC, or SOH. Furthermore, specific gravity measurements are messy and impossible to perform on sealed cells. Moreover, open-circuit voltage cannot be measured under load conditions and, at any rate, is imprecisely related to SOC because both "surface charge" and temperature affect it.

Because of these drawbacks, several techniques for correcting voltage of lead-acid batteries to obtain SOC have been proposed. These include techniques described by Christianson et al. in U.S. Pat. No. 3,946,299, by Reni et al. in U.S. Pat. No. 5,352,968, and by Hirzel in U.S. Pat. No. 5,381,096. However, such voltage correction methods are not very accurate. Furthermore, they are of little help with electrochemical systems other than lead-acid in which voltage may bear little relationship to SOC.

Due to these and other problems, techniques based upon ac or time-varying signals have been proposed for determining SOC. For example, Latner claims to determine SOC of NiCd batteries from ac bridge measurements of farad capacitance in U.S. Pat. No. 3,562,634. U.S. Pat. No. 3,984,762 to Dowgiallo purports to determine SOC from the phase angle of the complex impedance at a single frequency. In U.S. Pat. No. 4,743,855, Randin et al. assert that SOC can be determined from the argument (i.e., phase angle) of the difference between complex impedances measured at two different frequencies. Bounaga, in U.S. Pat. No. 5,650,937, reportedly determines SOC from measurements of the imaginary part of the complex impedance at a single frequency. Basell et al. purport to determine SOC from the rate of change of impedance with frequency in U.S. Pat. No. 5,717,336. Ding et al., in U.S. Pat. No. 6,094,033, broadly assert that SOC can be determined from a battery's "impedance response, which can include series and parallel equivalent circuit parameters, i.e., resistance, capacitance, and phase angle, among others". Finally, techniques purporting to determine SOC from the transient response to an applied pulsed voltage and/or current are disclosed by Andrieu and Poignant in U.S. Pat. No. 5,530,361 and by Simon in French Patent Application FR 2,749,396A. The fact that none of these methods has gained wide acceptance, however, suggests that they may not be altogether satisfactory methods for determining SOC.

SUMMARY OF THE INVENTION

Testing apparatus senses the time-varying electrical response of an electrochemical cell/battery to time-varying electrical excitation. The cell/battery may, or may not, be in service. Computation circuitry responsive to the time-varying electrical response evaluates elements of a unique circuit model representation of the cell/battery. Performance parameters and physical parameters are computed from these element values. Computed performance parameters include, but are not limited to, "total storage capacity", "absolute stored charge", "state-of-charge", "absolute cranking current", "fully charged cranking current", and "state-of-health". Computed physical parameters include, but are not limited to, "exchange current", "maximum exchange current", "charge transfer conductance", "maximum charge transfer conductance", "double layer capacitance", and "maximum double layer capacitance". Computed parameters are either displayed to the user, employed to initiate an alarm, or used to control a process such as charging the cell/battery.

DETAILED DESCRIPTION OF THE PREFERRED EMBODIMENTS

Method and apparatus for quickly and accurately determining performance parameters and physical parameters that does not discharge the battery, does not require the battery to be fully charged, and tests batteries while "on line" would be of great value. The present invention addresses this need. It is based upon teachings disclosed by Champlin in U.S. Pat. Nos. 6,002,238, 6,037,777, 6,172,483, 6,222,369, 6,262,563, 6,313,607, and U.S. patent application Ser. Nos. 60/299,876 and 09/940,684, all of which are incorporated herein by reference.

Figure 1:
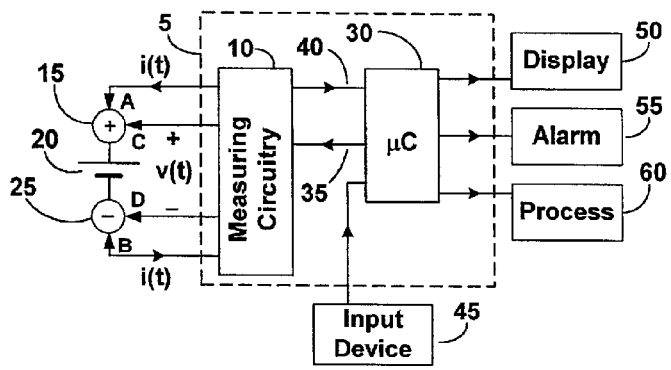
FIG. 1 is a block diagram of apparatus for evaluating performance parameters and physical parameters of an electrochemical cell or battery in accordance with one embodiment of the present invention.

FIG. 1 discloses a block diagram of apparatus 5 for evaluating performance parameters and/or physical parameters according to one embodiment of the present invention. Measuring circuitry 10 electrically couples to cell/battery 20 at positive terminal 15 and negative terminal 25 by means of current-carrying contacts A and B and voltage-sensing contacts C and D. Cell/battery 20 may, or may not, be in service. Under control of microcontroller circuitry 30 via control path 35, measuring circuitry 10 passes periodic time-varying excitation current i(t) through contacts A and B and senses periodic time-varying response voltage v(t) across contacts C and D. Amplification and analog to digital conversion circuitry contained within measuring circuitry 10 formulates digital representations of i(t) and v(t) samples and communicates them to microcontroller circuitry 30 via data path 40.

By appropriately processing these digital representations, microcontroller circuitry 30 computes real and imaginary parts of complex immittance—either impedance Z or admittance Y—at a measuring frequency $f_k$; where $f_k$ is a discrete frequency contained in the periodic waveforms of i(t) and v(t). Microcontroller circuitry 30 commands measuring circuitry 10 to repeat these measurements at each one of n discrete measuring frequencies, where n is an integer number equal to or greater than 3. This action defines 2n experimental quantities: the values of the n real parts and the n imaginary parts of complex immittance at each of the n measuring frequencies. Microcontroller circuitry 30 then employs algorithms disclosed in U.S. Pat. Nos. 6,037,777 and 6,222,369 to numerically combine the 2n experimental quantities to evaluate the 2n elements of the circuit model representation of the cell/battery disclosed in FIG. 2. This unique circuit model comprises a single series R-L subcircuit in series with a plurality, n-1, of parallel G-C subcircuits.

Figure 2:
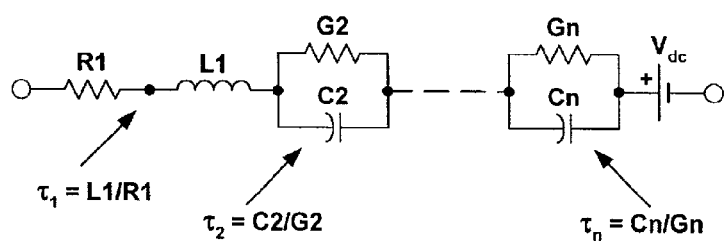
FIG. 2 depicts a generic 2n-element small signal circuit model representation of an electrochemical cell or battery employed in the present invention.

Microcontroller circuitry 30 computes one or more performance and/or physical parameters of cell/battery 20 from values of one or more elements of this circuit model representation of FIG. 2. Additionally, microcontroller circuitry 30 can compare one or more computed parameters with battery rating information inputted by a user on input device 45 to determine the battery's "state-of-health" SOH. Finally, microcontroller circuitry 30 can output appropriate performance or physical parameters to a user on display 50, and/or apply one or more computed parameters to initiate an alarm 55 or to control a process 60 such as charging of the battery.

Figure 3:
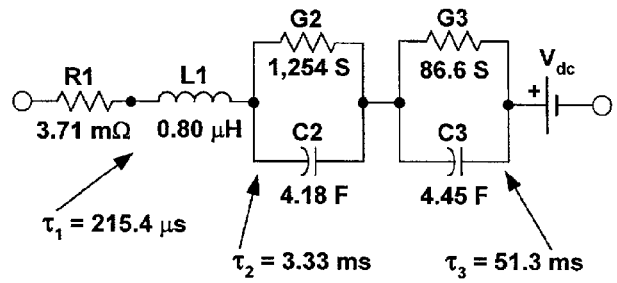
FIG. 3 depicts the six-element small signal circuit model representation of a particular fully charged 12V VRLA battery determined from complex immittance measurements at 5 Hz, 50 Hz, and 500 Hz.

FIG. 3 discloses the six-element circuit model of a fully charged 12V battery as determined with the apparatus of FIG. 1 using n=3. The experimental battery was a VRLA (valve-regulated lead-acid) automotive battery of spiral-grid construction that was rated 700 CCA, 95 minutes reserve capacity, and 50 Ah capacity @ 20 hour rate. The three measurement frequencies were 5, 50, and 500 Hz.

One notes from FIG. 3 that the n=3 circuit model comprises three two-element subcircuits in series:

A series R1-L1 subcircuit.
A parallel G2-C2 subcircuit.
A parallel G3-C3 subcircuit.

One notes further that the three subcircuits are characterized by three very different time constants. The shortest time constant, $\tau_1 = L1/R1 = 215.4\ \mu S$, belongs to the series R1-L1 subcircuit. The next longest time constant, $\tau_2 = C2/G2 = 3.33$ mS, belongs to the parallel G2-C2 subcircuit; and the longest time-constant, $\tau_3 = C3/G3 = 51.3$ mS, belongs to the parallel G3-C3 subcircuit. Accordingly, the three subcircuits represent quite different physical processes that can be differentiated from one another by their time constants.

By analyzing similar three-frequency measurements on many lead-acid batteries, a consistent physical interpretation of the circuit model of FIG. 3 has emerged. The theoretical basis for this interpretation can be found in the paper by Champlin and Bertness, "Results of Discrete Frequency Immittance Spectroscopy (DFIS) Measurements of Lead Acid Batteries", *Proceedings of the 23$^{rd}$ International Telecommunications Energy Conference (INTELEC)*, Edinburgh Scotland, paper 53, (October 2001).

According to this interpretation, series resistance R1 represents the current-induced drop in electric potential across the metal connectors, plates, separators, active material, and electrolyte—with the majority of R1 associated with the active material and electrolyte. Accordingly, conductance G1=1/R1 correlates directly with high-rate load-test current such as cold-cranking amps (CCA). Series inductance L1 describes energy storage in the battery's surrounding magnetic field, with no electrochemical component to L1 yet observed.

Both the parallel G2-C2 subcircuit and the parallel G3-C3 subcircuit are believed to be linearized representations of nonlinear electrochemical processes occurring at the negative electrode surfaces. These two subcircuits together describe the response of negative electrode surfaces to changes in an externally applied electrochemical overpotential.

Electrochemical overpotential at an electrode surface consists of two parts: an electrical overpotential and a chemical overpotential. The electrical part arises from electrical forces on charged particles, and the chemical part arises from concentration differences. The faster G2-C2 subcircuit responds to the electrical part of an electrochemical overpotential and the slower G3-C3 subcircuit responds to the chemical part. These two subcircuits add in series in the circuit model of FIG. 3 because the electrical overpotential and the chemical overpotential add together to form the electrochemical overpotential. Voltages (potentials) add in series.

Figure 4:
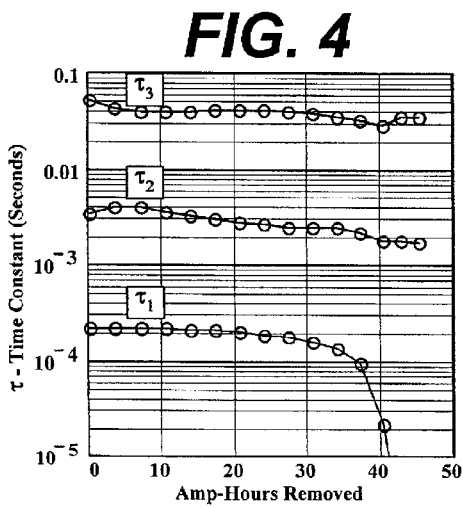
FIG. 4 is a plot of the variation of the three subcircuit time-constants defined in FIG. 3 as charge is removed from the battery.
Figure 5:
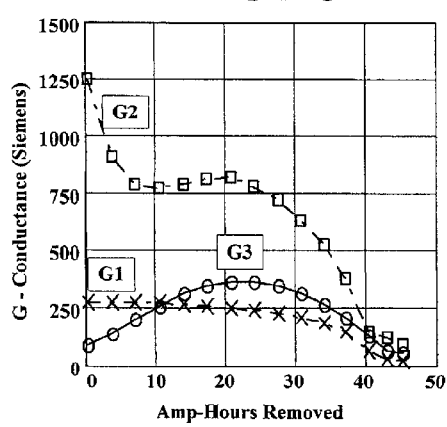
FIG. 5 is a plot of values of the three conductances defined in FIG. 3 as charge is removed from the battery.
Figure 6:
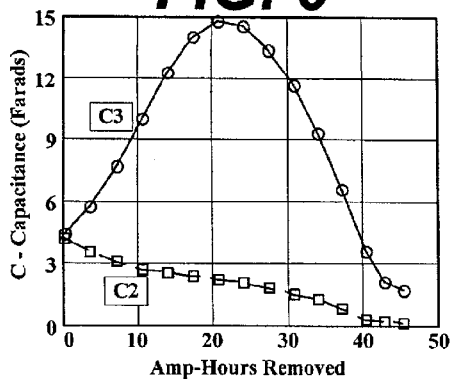
FIG. 6 is plot of values of capacitances C2 and C3 defined in FIG. 3 as charge is removed from the battery.

FIGS. 4, 5, and 6 display the results of three-frequency immittance measurements performed on the battery whose model is depicted in FIG. 3 during a discharge sequence. The battery was initially charged, allowed to reach equilibrium, and was then repeatedly discharged at an approximate 8-hr rate in increments of approximately 3 ampere-hours. The battery was permitted to rest for 2.5 hours after each discharge period before the three-frequency immittance measurements were taken.

FIG. 4 is a plot of the variation of the three time constants defined in FIG. 3 as charge is removed from the battery. One notes that the time constants remain widely separated as charge is removed, and that the longest of the three, $\tau_3$, is nearly independent of state-of-charge.

FIG. 5 discloses the variation of the three conductances, G1=1/R1, G2, and G3 as charge is removed from the battery. Of particular interest is the fact that G3 becomes small near full charge as well as near full discharge. This remarkable behavior sets G3 apart from G1 and G2, both of which reach maxima at full charge. Such unusual behavior can be explained by assuming that G3 describes faradaic processes occurring at the negative electrode surfaces and considering the kinetics of such processes.

The Butler-Volmer equation for faradaic processes at the negative electrode surfaces can be written:

$$i = i_f - i_b = i_0 (e^{\alpha nfV_3} - e^{-\{1-\alpha\}nfV_3}) \quad (1)$$

In equation (1), i is the current in the external circuit (assumed positive in the "charge" direction) while $i_f$ and $i_b$ are "forward" and "backward" ionic "reaction" currents, respectively, in the electrolyte. Physical parameter $i_0$ is the "exchange current"; $\alpha$ is "charge transfer coefficient" (less than unity) n is the number of electrons transferred per molecule reactant (two); and f=(F/RT), with F being Faraday's constant, R the universal gas constant, and T the absolute (Kelvin) temperature. Voltage $V_3$ in equation (1) is believed to be the chemical component of the electrochemical overpotential (positive for "charge" and negative for "discharge") at the negative electrode surfaces.

The chemical overpotential, $V_3$, drives the two ionic reaction currents. Under charging conditions ($V_3 > 0$), the forward ionic current, $i_f = i_0 \exp(\alpha nfV_3)$, is larger than $i_0$; while the backward ionic current, $i_b = i_0 \exp(-\{1-a\}nfV_3)$ is less than $i_0$. Accordingly, their difference yields a positive ("charging") current in the external circuit. Under discharging conditions ($V_3 < 0$), the opposite is true. In equilibrium ($V_3 = 0$), both forward and backward ionic currents are equal to the exchange current $i_0$, and the current in the external circuit is zero. Note that even with i=O, there are still two equal ionic "exchange currents" flowing in opposite directions on the electrolyte side of the electrode/electrolyte interface.

For small variations in $V_3$, the equilibrium small-signal faradaic conductance, or "charge transfer conductance", follows by differentiating equation (1) with respect to ($N_C V_3$), where $N_C$ is the number of battery cells in series, and evaluating this derivative at $V_3=0$. The result is $$G3 = \frac{di}{d(N_C V_3)}\bigg|_{V_3=0} = \frac{nfi_0}{N_C} = (nF/N_C RT)\cdot i_0 \qquad (2)$$

One sees that at any given temperature, the "charge transfer conductance" G3 is proportional to the "exchange current" $i_0$. The "charge transfer conductance" and electrode "exchange current" are both physical parameters of great importance.

Equation (2) can be inverted to yield the "exchange current" $i_0$ in terms of "charge transfer conductance" G3. For a 12V (6-cell) battery at room temperature (T=293° K.), equation (2) yields $$i_0 = (N_C RT/nF)\cdot G3 = (0.07574)\cdot G3 \text{ amperes} \qquad (3)$$

Figure 7:
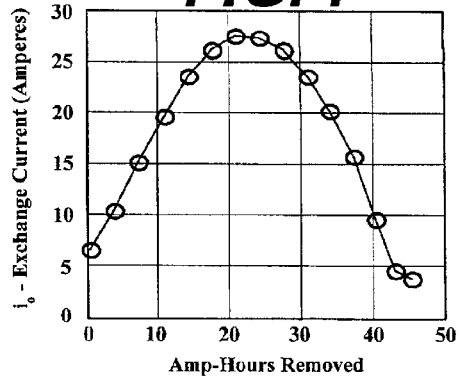
FIG. 7 is a plot of the "exchange current" $i_0$ derived from "charge transfer conductance" G3 of FIG. 5 as charge is removed from the battery.

FIG. 7 displays $i_0$ calculated from equation (3) using the experimental G3 data of FIG. 5. One sees that $i_0$ approaches zero at both full charge and full discharge and reaches a maximum value of $i_{0max}=27.5$ amperes at approximately 50% state-of-charge.

The remarkable variation of G3 disclosed in FIG. 5 can now be explained. As the battery approaches full charge, the forward, or "charge", component of reaction current goes to zero because the number of reaction sites available for the charge reaction ($PbSO_4$ sites) approaches zero. Since forward and backward ionic currents are equal in equilibrium, the equilibrium backward current likewise goes to zero. Similarly, as the battery approaches full discharge, the backward, or "discharge", component of reaction current goes to zero because the number of sites available for the discharge reaction (Pb sites) approaches zero. Again, since forward and backward ionic currents are equal in equilibrium, the equilibrium forward current likewise goes to zero. Accordingly, the "exchange current" $i_0$ goes to zero in both cases. From equation (2), the "charge transfer conductance" G3—which is simply proportional to $i_0$—likewise approaches zero at full charge and at full discharge, reaching maximum at 50% state-of-charge.

By reasoning in accordance with this mechanism, one can write "charge transfer conductance" G3 as $$G3 = 4\cdot G3_{max}\cdot(N_{Pb}^-/N^-)\cdot(N_{PbSO_4}^-/N^-) \qquad (4)$$

where $N^- = N_{Pb}^- + N_{PbSO_4}^{4-}$ is the total number of negative-electrode reaction sites, $N_{Pb}^-$ is the number of such sites occupied by Pb molecules, and $N_{PbSO_4}^{4-}$ is the number occupied by $PbSO_4$ molecules. The factor 4 in equation (4) arises because G3 equals $G3_{max}$ when $N_{Pb}^- = N_{PbSO_4}^{4-} = N^-/2$.

I now define the performance parameter "state-of-charge" SOC as the fraction of negative-electrode reaction sites occupied by Pb molecules. That is, $$SOC \equiv (N_{Pb}^-/N^-) = 1 - (N_{PbSO_4}^-/N^-) \qquad (5)$$

Equation (4) can therefore be written $$G3 = 4\cdot G3_{max}\cdot(SOC)\cdot(1-SOC) \qquad (6)$$

which obviously approaches zero when SOC approaches unity as well as zero.

FIG. 6 discloses the variation of capacitance C2 and capacitance C3 as charge is removed from the battery. Capacitance C3 is seen to mimic the behavior of "charge transfer conductance" G3 over the complete range of Ah removed. This variation can be understood by noting that $C3=\tau_3\cdot G3$, and that $\tau_3$ varies little as charge is removed (see FIG. 4). Time constant $\tau_3$ is believed closely related to the reaction time of faradaic processes at the negative electrode surfaces (See U.S. Pat. Nos. 6,137,269 and 6,294,697).

Capacitance C2 in FIG. 6 is observed to vary in an entirely different manner from C3 as charge is removed. Instead of increasing and then decreasing, C2 assumes its largest value with zero amp-hours removed and simply decreases monotonically as charge is removed from the battery. Such behavior suggests that the G2-C2 subcircuit is responsive to the nonfaradaic or electrical component of an electrochemical overpotential at the negative-electrode surfaces. In this interpretation, capacitance C2 represents the negative-electrode's ionic "double layer capacitance"—a physical parameter of considerable interest.

An ionic double layer can only form on metallic Pb molecules. It cannot form on nonconducting $PbSO_4$ molecules. It follows that C2 is proportional to $N_{Pb}^-$, the total number of reaction sites that are occupied by Pb molecules. Accordingly, "double layer capacitance" C2 can be written $$C2 = C2_{100}\cdot(N_{Pb}^-/N^-) = C2_{100}\cdot SOC \qquad (7)$$

where $C2_{100}$ is "maximum double layer capacitance"—the value that would occur at 100% state-of-charge.

Equation (7) indicates that physical parameter $C2_{100}$ relates to battery size and condition by being proportional to $N^-$, the total number of reaction sites available for charge/discharge reactions. Similarly, equation (4) indicates that physical parameter $G3_{max}$ relates to size and condition by being proportional to $(N^-)^2$. Accordingly, I define the following useful quantity:

$$\xi \equiv \frac{(C2_{100})^2}{4\cdot G3_{max}} \qquad (8)$$

which, for any particular class of cell/battery, is independent of battery size, condition and "state-of-charge". I have found that $\xi \approx 1.368\cdot 10^{-2}$ for batteries of the type under consideration herein.

Equations (6), (7), and (8) can be combined algebraically to provide separate expressions for SOC, $C2_{100}$, and $G3_{max}$ in terms of $\xi$, C2, and G3. The results are $$SOC = \frac{1}{1+\xi\cdot(G3/C2^2)} \qquad (9)$$

$$C2_{100} = C2 + \xi\cdot(G3/C2) \qquad (10)$$

and $$G3_{max} = \frac{\{C2 + \xi\cdot(G3/C2)\}^2}{4\cdot\xi} \qquad (11)$$

By combining equation (3) and equation (11), "maximum exchange current" $i_{0max}$ can be written as $$i_{0max} = \frac{\{N_C RT/nF\}\cdot\{C2 + \xi\cdot(G3/C2)\}^2}{4\cdot\xi} \qquad (12)$$

This physical parameter is of considerable theoretical interest since it describes the level of maximum chemical activity at the electrode/electrolyte interface.

Figure 8:
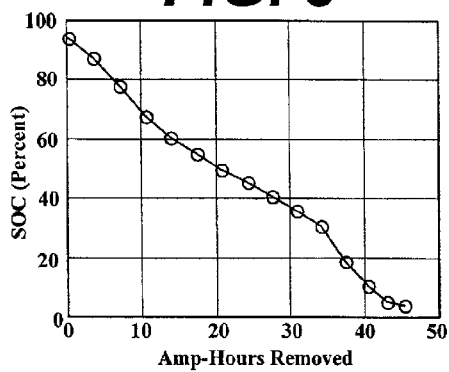
FIG. 8 is a plot of the "state-of-charge" SOC derived from "charge transfer conductance" G3 of FIG. 5 and "double layer capacitance" C2 of FIG. 6 as charge is removed from the battery.

FIG. 8 displays performance parameter SOC (in percent) calculated from equation (9) by using the experimental G3 and C2 data disclosed in FIGS. 5 and 6. Note that combining G3 and C2 data to determine SOC resolves the multi-value ambiguity of equation (6). The "state-of-charge" determined in this manner varies from a maximum value of 93.6%, with zero ampere-hours removed from the battery, to a minimum value of 4.1% with 45.2 ampere-hours removed. The observed, nearly linear, variation of SOC with ampere-hours removed provides excellent corroboration of the theory.

The performance parameters "absolute stored charge" ASC and "total storage capacity" TSC are proportional to C2 and $C2_{100}$, respectively. Accordingly, I write $$ASC = K_{cs} \cdot C2 \tag{13}$$

and, from equation (10)

$$TSC = K_{cs} \cdot \{C2 + \xi \cdot (G3/C2)\} \tag{14}$$

where $K_{cs}$ is a "charge storage" constant that depends upon the battery type, and upon the units of charge storage (i.e., ampere-hours @ an 8 hr rate, ampere-hours @ a 20 hr rate, reserve capacity minutes, coulombs, etc.) I find that for batteries of the type under consideration herein, and with ASC and TSC expressed in ampere-hours @ an 8 hr rate, $K_{cs} \cong 11.3$.

Taking the ratio of equation (13) to equation (14) shows that $$\frac{ASC}{TSC} = \frac{C2}{C2 + \xi \cdot (G3/C2)} = \frac{1}{1 + \xi \cdot (G3/C2^2)} = SOC \tag{15}$$

Thus, the performance parameter "state-of-charge" SOC, that is defined physically in terms of numbers of reaction sites by equation (5), is actually the ratio of the two performance parameters "absolute stored charge" ASC and "total storage capacity" TSC.

Figure 9:
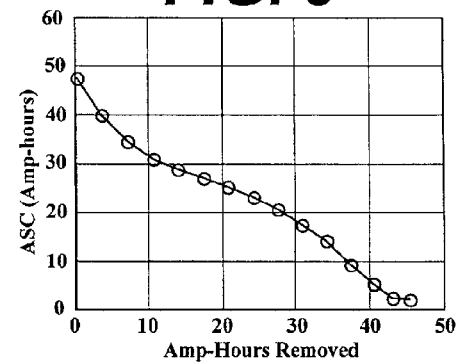
FIG. 9 is a plot of the "absolute stored charge" ASC determined from "double layer capacitance" C2 of FIG. 6 as charge is removed from the battery.

FIG. 9 displays performance parameter "absolute stored charge" ASC (in ampere-hours) calculated from equation (13) using the experimental C2 data disclosed in FIG. 6. The "absolute stored charge" determined in this manner varies from a maximum value of 47.2 ampere-hours, with zero ampere-hours removed from the battery, to a minimum value of 1.9 ampere-hours with 45.2 ampere-hours removed. Note that "absolute stored charge" ASC decreases as the battery discharges—much like the level of liquid in a fuel tank. Accordingly, ASC would comprise an excellent "electric fuel gauge" readout.

Figure 10:
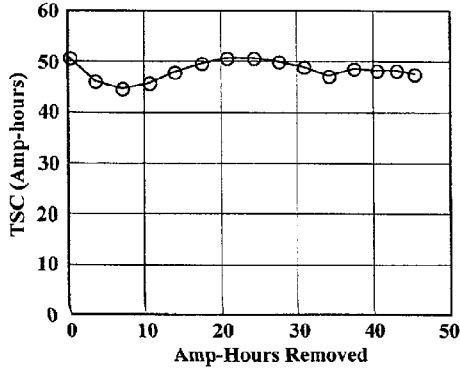
FIG. 10 is a plot of the "total storage capacity" TSC derived from "charge transfer conductance" G3 of FIG. 5 and "double layer capacitance" C2 of FIG. 6 as charge is removed from the battery.

FIG. 10 displays the performance parameter "total storage capacity" TSC (in ampere-hours) calculated from equation (14) using the experimental G3 and C2 data disclosed in FIGS. 5 and 6. Note that the observed TSC varies very little as the battery is discharged. Ideally, TSC would not vary at all. The small variations observed are believed caused by minor inaccuracies in the n=3 model. Performing immittance measurements at four or five frequencies and then employing an eight- or ten-element circuit model in the analysis greatly reduces such variations.

Figure 11:
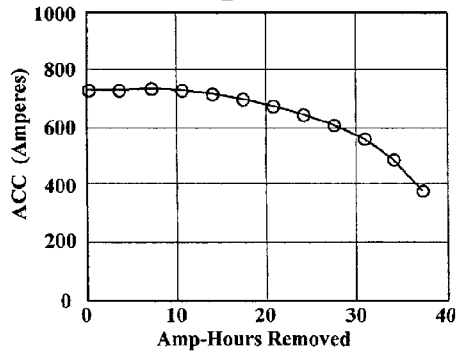
FIG. 11 is a plot of the "absolute cranking current" ACC derived from series conductance G1=1/R1 of FIG. 5 as charge is removed from the battery.

Performance parameter "absolute cranking current" ACC has been found experimentally to be proportional to G1=1/R1. Thus $$ACC = K_{cc} \cdot G1 \tag{16}$$

where $K_{cc}$ is a "cranking current" coefficient that depends upon the type of battery and the definition of "cranking current". For batteries of the type under consideration, and with "cranking current" defined to be SAE "cold cranking amperes", $K_{cc} \cong 2.7$. FIG. 11 displays performance parameter ACC determined from equation (16) by using the G1 data of FIG. 5. One sees that ACC decreases significantly as charge is removed from the battery.

Figure 12:
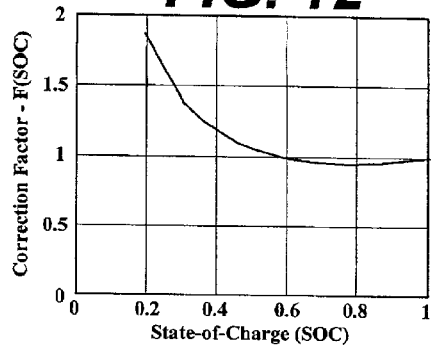
FIG. 12 is a plot of the function used to correct the "absolute cranking current" ACC for "state-of-charge" SOC to obtain the "fully charged cranking current" FCCC of FIG. 13.

For batteries that are less than fully charged, the performance parameter "fully charged cranking current" FCCC can be determined by correcting the ACC according to $$FCCC = ACC \cdot F(SOC) \tag{17}$$

where F(SOC) is a "correction factor" that depends upon "state-of-charge". FIG. 12 discloses an emperically determined F(SOC) for correcting the ACC of batteries of the type under consideration. This function can be expressed mathematically as $$F(SOC) = \frac{1}{1 - 0.5 \cdot (SOC - 1) - 1.0 \cdot (SOC - 1)^2 + 0.4 \cdot (SOC - 1)^3} \tag{18}$$

Figure 13:
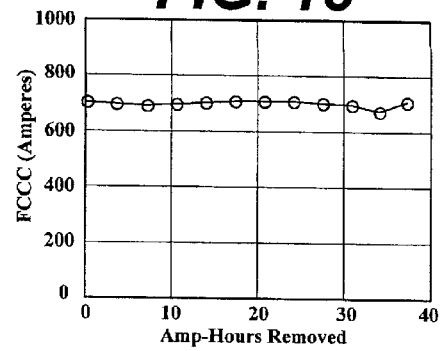
FIG. 13 is a plot of the corrected "fully charged cranking current" FCCC as charge is removed from the battery.

FIG. 13 displays performance parameter FCCC obtained by correcting the data of FIG. 11 according to equation (17) using the correction factor defined by equation (18) (FIG. 12). One sees that the corrected FCCC varies by only ±2.7% from 695 amperes over the entire range of discharge down to SOC=20%.

One determines the performance parameter "state-of-health" SOH by either of two methods. The first method is to compare the computed "total storage capacity" TSC with an appropriate user-inputted capacity rating such as the battery's rated "ampere-hour capacity" or rated "reserve capacity" in minutes. The second method is to compare the computed "fully charged cranking current" FCCC with an appropriate user-inputted cranking rating such as the battery's rated "cold cranking amperes" (CCA). In either case, the battery is assumed to have "failed" the SOH test if the calculated parameter value is less than a predetermined fraction, say 75%, of the rated parameter value. Either SOH method, or both methods, may be employed—depending upon the type of service that the battery is expected to experience.

Figure 14:
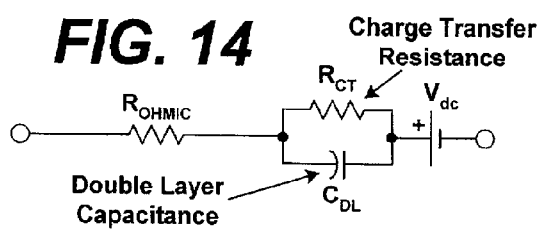
FIG. 14 is a diagram of the "commonly accepted" circuit model showing the placement of a "charge transfer resistance" and "double layer capacitance" in parallel with one another.
Figure 15:
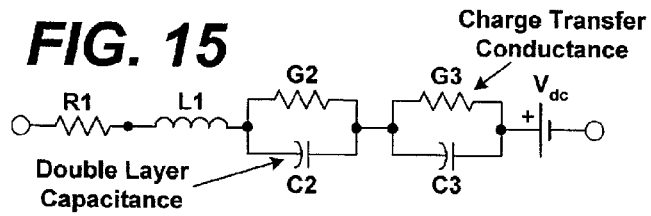
FIG. 15 is a diagram of the n=3 circuit model according to the present invention showing the placement of the "charge transfer conductance" and the "double layer capacitance" in two separate G-C subcircuits that are actually in series with one another.

This completes the disclosure of my invention. FIGS. 14 and 15, however, will serve to place the innovative nature of my invention in perspective. FIG. 14 illustrates the "commonly accepted" equivalent circuit model of a cell/battery at the present time. (See, e.g., U.S. Pat. No. 6,167,349 to Alvarez. See also E. Karden, et al., "A method for measurement and interpretation of impedance spectra for industrial batteries", J Power Sources 85 (2000), pp. 72–78.) The "commonly accepted" model, also known as the "Randles equivalent circuit", places a "charge transfer resistance" and a "double layer capacitance" in parallel with one another. In my opinion, this model is fundamentally wrong and cannot possibly lead to correct evaluation of any of the performance parameters or physical parameters evaluated herein.

My measurements and analysis have shown that the "charge transfer conductance" (the reciprocal of "charge transfer resistance") and the "double layer capacitance" are elements of two separate G-C subcircuits that are actually in series with one another in the correct circuit model (see FIG. 15). Furthermore, the "double layer capacitance" of the correct model varies directly with the number of reaction sites available for the discharge reaction (equation (7)); while the "charge transfer conductance" of the correct model varies directly with both the number of sites available for the discharge reaction and also the number available for the charge reaction (equation (4)). These important new discoveries set my work totally apart from all of the prior art.

To summarize, I have herein disclosed new methods and apparatus for evaluating the following six performance parameters:

1. "Absolute stored charge" ASC (equation (13)).
2. "Total storage capacity" TSC (equation (14)).
3. "State-of-charge" SOC=ASC/TSC (equation (9)).
4. "Absolute cranking current" ACC (equation (16)).
5. "Fully Charged Cranking Current" FCCC (equation (17)).
6. "State-Of-Health" SOH.

Furthermore, in the course of this disclosure I have also revealed new methods and apparatus for evaluating the following six important physical parameters:

1. "Exchange current" $i_0$ (equation (3)).
2. "Maximum exchange current" $i_{0max}$ (equation (12)).
3. "Charge transfer conductance" G3.
4. "Maximum charge transfer conductance" $G3_{max}$ (equation (11)).
5. "Double layer capacitance" C2.
6. "Maximum double layer capacitance" $C2_{100}$ (equation (10)).

My invention, however, is not limited to evaluating only these twelve parameters.

Although my disclosure has referred to particular apparatus and algorithms previously disclosed in U.S. Pat. Nos. 6,002,238, 6,037,777, 6,172,483, 6,222,369, and 6,262,563, other methods will be apparent to those skilled in the art. For example, one could evaluate elements of the correct circuit model by using pulsed or stepped excitation such as that described in U.S. Pat. No. 6,118,275 to Yoon or in U.S. Pat. No. 6,167,349 to Alvarez; or by using random or pseudo-random excitation such as that described in PCT Application WO 99/18448 to Scott. One could also employ bridges, frequency response analyzers, or other types of ac instrumentation to measure complex admittance or complex impedance at multiple frequencies. The range of measurement frequencies is unrestricted and could include frequencies in the millihertz and microhertz region (f<1) as well as frequencies in the range of hertz (f>1).

Figure 16:
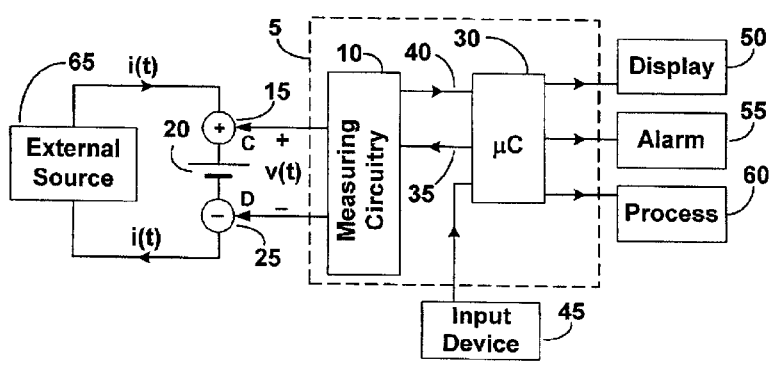
FIG. 16 is a block diagram of apparatus for evaluating performance and physical parameters of an electrochemical cell or battery wherein an external source produces time-varying electrical excitation

The embodiment disclosed in FIG. 1 utilizes time-varying electrical excitation i(t) generated internally to apparatus 5 by internal measuring circuitry 10. Alternatively however, the requisite time-varying electrical excitation could be developed by an external source 65 as disclosed in FIG. 16. Such an external source could simply comprise normal "noise" currents flowing through a cell/battery during service, such as taught in PCT Application WO 93/22666 to Robinson. It could also comprise "ripple" signals arising from an unfiltered battery charger during bench-charging of the cell/battery or charging by an alternator in a vehicle. Although, time-varying current i(t) has been presented as an electrical excitation and time-varying voltage v(t) as an electrical response, the roles of i(t) and v(t) could be reversed. Time-varying voltage v(t) could be the electrical excitation and time-varying current i(t) the electrical response. All such modifications and variations are included in my invention.

It is well known that elements of any circuit model can be readily subdivided and rearranged to obtain a derivative circuit that appears to be quite different, but is in effect electrically equivalent to the original circuit. My invention includes all such derivative circuits that are electrically equivalent to the models of FIG. 2 and/or FIG. 3. One could use a circuit model containing, e.g., eight or ten elements rather than the six elements treated herein. This straightforward modification is likewise included in my invention.

Instead of the algorithms disclosed in U.S. Pat. Nos. 6,037,777 and 6,222,369 to evaluate elements of the circuit model, one could simply employ a conventional "complex least-squares curve fitting" procedure. If accuracy is not essential, one could even take advantage of the fact that the time constants are widely separated from one another and simply assume that the subcircuits are not coupled. Thus, with some batteries, it may be possible to obtain a reasonably accurate circuit model from a very simple computational analysis of measured time-varying electrical response.

The invention is not limited to the particular circuitry implementations disclosed herein. Measuring circuitry, electrical excitation circuitry, electrical response sensing circuitry, computational circuitry, etc., can be implemented in hardware, software, or combinations thereof. Such circuitry can share common elements or be implemented with common components such as a common microprocessor, microcontroller, or personal computer. Workers skilled in the art will recognize that these and other variations may be made in form and detail without departing from the true spirit and scope of my invention.

What is claimed is:

1. Apparatus for determining one or more parameters of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model comprising the series combination of a series R-L subcircuit and a plurality of parallel G-C subcircuits, said computation circuitry further adapted to evaluate one or more said parameters from values of one or more said elements.

2. The apparatus of claim 1 wherein said time-varying electrical excitation comprises current excitation and said time-varying electrical response comprises voltage response.

3. The apparatus of claim 1 wherein said time-varying electrical excitation comprises voltage excitation and said time-varying electrical response comprises current response.

4. The apparatus of claim 2 wherein a source external to said apparatus applies said time-varying electrical excitation to said cell or battery.

5. The apparatus of claim 4 wherein said source comprises a cell/battery charger or an alternator employed to charge said electrochemical cell or battery.

6. The apparatus of claim 1 including a display device coupled to said computation circuitry for conveying one or more said parameters to a user.

7. The apparatus of claim 1 wherein said computation circuitry couples to a process device controlled by said computation circuitry in accordance with the computed value or values of one or more said parameters.

8. The apparatus of claim 7 wherein said process device is a cell/battery charger charging said electrochemical cell or battery.

9. The apparatus of claim 1 wherein said computation circuitry couples to an alarm actuated in accordance with the computed value or values of one or more said parameters.

10. The apparatus of claim 1 wherein one said parameter is absolute stored charge.

11. The apparatus of claim 10 wherein said computation circuitry computes said absolute stored charge from the value of the capacitance element of a particular parallel G-C subcircuit of said electrical circuit representation.

12. The apparatus of claim 1 wherein one said parameter is exchange current.

13. The apparatus of claim 12 wherein said computation circuitry computes said exchange current from the value of the conductance element of a particular parallel G-C subcircuit of said electrical circuit representation.

14. The apparatus of claim 1 wherein one said parameter is state-of-charge.

15. The apparatus of claim 14 wherein said computation circuitry computes said state-of-charge from the value of the conductance element of a particular parallel G-C subcircuit and the value of the capacitance element of a different parallel G-C subcircuit of said electrical circuit representation.

16. The apparatus of claim 1 wherein one said parameter is total storage capacity.

17. The apparatus of claim 16 wherein said computation circuitry computes said total storage capacity from the value of the conductance element of a particular parallel G-C subcircuit and the value of the capacitance element of a different parallel G-C subcircuit of said electrical circuit representation.

18. The apparatus of claim 1 wherein one said parameter is maximum exchange current.

19. The apparatus of claim 18 wherein said computation circuitry computes said maximum exchange current from the value of the conductance element of a particular parallel G-C subcircuit and the value of the capacitance element of a different parallel G-C subcircuit of said electrical circuit representation.

20. The apparatus of claim 1 wherein one said parameter is charge transfer conductance.

21. The apparatus of claim 20 wherein said computation circuitry computes said charge transfer conductance from the value of the conductance element of a particular parallel G-C subcircuit of said electrical circuit representation.

22. The apparatus of claim 1 wherein one said parameter is double layer capacitance.

23. The apparatus of claim 22 wherein said computation circuitry computes said double layer capacitance from the value of the capacitance element of a particular parallel G-C subcircuit of said electrical circuit representation.

24. The apparatus of claim 1 wherein one said parameter is maximum charge transfer conductance.

25. The apparatus of claim 24 wherein said computation circuitry computes said maximum charge transfer conductance from the value of the conductance element of a particular parallel G-C subcircuit and the value of the capacitance element of a different parallel G-C subcircuit of said electrical circuit representation.

26. The apparatus of claim 1 wherein one said parameter is maximum double layer capacitance.

27. The apparatus of claim 26 wherein said computation circuitry computes said maximum double layer capacitance from the value of the conductance element of a particular parallel G-C subcircuit and the value of the capacitance element of a different parallel G-C subcircuit of said electrical circuit representation.

28. The apparatus of claim 1 wherein one said parameter is absolute cranking current.

29. The apparatus of claim 28 wherein said computation circuitry computes said absolute cranking current from the value of the resistance element of said series R-L subcircuit.

30. The apparatus of claim 1 wherein one said parameter is fully charged cranking current.

31. The apparatus of claim 30 wherein said computation circuitry computes said fully charged cranking current from the value of the conductance element of a particular parallel G-C subcircuit, the value of the capacitance element of a different parallel G-C subcircuit, and the value of the resistance element of said series R-L subcircuit of said electrical circuit representation.

32. The apparatus of claim 31 wherein one said parameter is state-of-health.

33. The apparatus of claim 32 including an input device coupled to said computation circuitry wherein said computation circuitry computes state-of-health by comparing said fully charged cranking current with a reference number determined in accordance with a battery rating inputted on said input device.

34. The apparatus of claim 33 wherein said battery rating comprises a cold cranking ampere battery rating.

35. The apparatus of claim 17 wherein one said parameter is state-of-health.

36. The apparatus of claim 35 including an input device coupled to said computation circuitry wherein said computation circuitry computes state-of-health by comparing said total storage capacity with a reference number determined in accordance with a battery rating inputted on said input device.

37. The apparatus of claim 36 wherein said battery rating comprises an ampere-hour battery rating.

38. The apparatus of claim 36 wherein said battery rating comprises a reserve capacity battery rating.

39. A method for determining one or more parameters of an electrochemical cell or battery comprising:
   sensing time-varying electrical response to time-varying electrical excitation of said cell or battery;
   processing said time-varying electrical response to evaluate elements of a circuit model of said cell or battery comprising the series combination of a series R-L subcircuit and a plurality of parallel G-C subcircuits; and,
   determining values of one or more said parameters from values of one or more said elements.

40. The method of claim 39 wherein said time-varying electrical excitation comprises current excitation and said time-varying electrical response comprises voltage response.

41. The method of claim 39 wherein said time-varying electrical excitation comprises voltage excitation and said time-varying electrical response comprises current response.

42. The method of claim 40 including applying said time-varying electrical excitation to said cell or battery with an external source.

43. The method of claim 42 wherein said external source comprises a cell/battery charger or an alternator employed to charge said electrochemical cell or battery.

44. The method of claim 39 including displaying one or more said parameters to a user.

45. The method of claim 39 including controlling a process device in accordance with the value or values of one or more said parameters.

46. The method of claim 45 wherein said process device is a cell/battery charger charging said electrochemical cell or battery.

47. The method of claim 39 including actuating an alarm in accordance with values of one or more said parameters.

48. The method of claim 39 wherein one said parameter is absolute stored charge.

49. The method of claim 48 including determining said absolute stored charge from the value of the capacitance element of a particular parallel G-C subcircuit of said electrical circuit representation.

50. The method of claim 39 wherein one said parameter is exchange current.

51. The method of claim 50 including determining said exchange current from the value of the conductance element of a particular parallel G-C subcircuit of said electrical circuit representation.

52. The method of claim 39 wherein one said parameter is state-of-charge.

53. The method of claim 52 including determining said state-of-charge from the value of the conductance element of a particular parallel G-C subcircuit and the value of the capacitance element of a different parallel G-C subcircuit of said electrical circuit representation.

54. The method of claim 39 wherein one said parameter is total storage capacity.

55. The method of claim 54 including determining said total storage capacity from the value of the conductance element of a particular parallel G-C subcircuit and the value of the capacitance element of a different parallel G-C subcircuit of said electrical circuit representation.

56. The method of claim 39 wherein one said parameter is maximum exchange current.

57. The method of claim 56 including determining said maximum exchange current from the value of the conductance element of a particular parallel G-C subcircuit and the value of the capacitance element of a different parallel G-C subcircuit of said electrical circuit representation.

58. The method of claim 39 wherein one said parameter is charge transfer conductance.

59. The method of claim 58 including determining said charge transfer conductance from the value of the conductance element of a particular parallel G-C subcircuit of said electrical circuit representation.

60. The method of claim 39 wherein one said parameter is double layer capacitance.

61. The method of claim 60 including determining said double layer capacitance from the value of the capacitance element of a particular parallel G-C subcircuit of said electrical circuit representation.

62. The method of claim 39 wherein one said parameter is maximum charge transfer conductance.

63. The method of claim 62 including determining said maximum charge transfer conductance from the value of the conductance element of a particular parallel G-C subcircuit and the value of the capacitance element of a different parallel G-C subcircuit of said electrical circuit representation.

64. The method of claim 39 wherein one said parameter is maximum double layer capacitance.

65. The method of claim 64 including determining said maximum double layer capacitance from the value of the conductance element of a particular parallel G-C subcircuit and the value of the capacitance element of a different parallel G-C subcircuit of said electrical circuit representation.

66. The method of claim 39 wherein one said parameter is absolute cranking current.

67. The method of claim 66 including determining said absolute cranking current from the value of the resistance element of said series R-L subcircuit.

68. The method of claim 39 wherein one said parameter is fully charged cranking current.

69. The method of claim 68 including determining said fully charged cranking current from the value of the conductance element of a particular parallel G-C subcircuit, the value of the capacitance element of a different parallel G-C subcircuit, and the value of the resistance element of said series R-L subcircuit of said electrical circuit representation.

70. The method of claim 39 wherein one said parameter is state-of-health.

71. The method of claim 70 including inputting a battery rating with an input device and determining said state-of-health by comparing said fully charged cranking current with a reference number determined in accordance with said battery rating.

72. The method of claim 71 wherein said battery rating comprises a cold cranking ampere battery rating.

73. The method of claim 55 wherein one said parameter is state-of-health.

74. The method of claim 73 including inputting a battery rating with an input device and determining said state-of-health by comparing said total storage capacity with a reference number determined in accordance with said battery rating.

75. The method of claim 74 wherein said battery rating comprises an ampere-hour battery rating.

76. The method of claim 74 wherein said battery rating comprises a reserve capacity battery rating.

77. Apparatus for determining one or more parameters of an electrochemical cell or battery adapted to perform the method according to claim 39.

78. Apparatus for determining absolute stored charge of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said absolute stored charge from the value of the capacitance element of a particular parallel G-C subcircuit.

79. Apparatus for determining an exchange current of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said exchange current from the value of the conductance element of a particular parallel G-C subcircuit.

80. Apparatus for determining state-of-charge of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said state-of-charge from the value of the conductance element of a particular parallel G-C subcircuit and the value of the capacitance element of a different parallel G-C subcircuit.

81. Apparatus for determining total storage capacity of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said total storage capacity from the value of the conductance element of a particular parallel G-C subcircuit and the value of the capacitance element of a different parallel G-C subcircuit.

82. Apparatus for determining maximum exchange current of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said maximum exchange current from the value of the conductance element of a particular parallel G-C subcircuit and the value of the capacitance element of a different parallel G-C subcircuit.

83. Apparatus for determining absolute cranking current of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a series R-L subcircuit in series with a plurality of parallel G-C subcircuits, said computation circuitry further adapted to evaluate said absolute cranking current from the value of the resistance element of said series R-L subcircuit.

84. The apparatus of claim 83 wherein said computation circuitry computes fully charged cranking current by correcting said absolute cranking current with a correction factor evaluated using values of a capacitance element contained in a particular parallel G-C subcircuit and a conductance element contained in a different parallel G-C subcircuit of said circuit model.

85. The apparatus of claim 84 including an input device wherein said computation circuitry computes state-of-health by comparing said fully charged cranking current with a reference number in accordance with a battery rating inputted on said input device.

86. The apparatus of claim 85 wherein said battery rating comprises a cold cranking ampere battery rating.

87. The apparatus of claim 81 including an input device wherein said computation circuitry computes state-of-health by comparing said total storage capacity with a reference number in accordance with a battery rating inputted on said input device.

88. The apparatus of claim 87 wherein said battery rating comprises an ampere-hour battery rating.

89. The apparatus of claim 87 wherein said battery rating comprises a reserve capacity battery rating.

90. Apparatus for determining a charge transfer conductance of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said charge transfer conductance from the value of the conductance element of a particular parallel G-C subcircuit.

91. Apparatus for determining a double layer capacitance of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said double layer capacitance from the value of the capacitance element of a particular parallel G-C subcircuit.

92. Apparatus for determining a maximum charge transfer conductance of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said maximum charge transfer conductance from the values of the capacitance element of a particular parallel G-C subcircuit and the conductance element of a different parallel G-C subcircuit.

93. Apparatus for determining a maximum double layer capacitance of an electrochemical cell or battery comprising:

response sensing circuitry coupled to said cell or battery and adapted to sense time-varying electrical response of said cell or battery generated as a result of time-varying electrical excitation of said cell or battery; and, computation circuitry coupled to said response sensing circuitry and adapted to utilize said response to evaluate elements of a circuit model containing a plurality of parallel G-C subcircuits connected in series, said computation circuitry further adapted to evaluate said maximum double layer capacitance from the values of the capacitance element of a particular parallel G-C subcircuit and the conductance element of a different parallel G-C subcircuit.

94. A method for determining the absolute stored charge of an electrochemical cell or battery comprising:

sensing time-varying electrical response to time-varying electrical excitation of said cell or battery;

processing said time-varying electrical response to evaluate the capacitance element of a particular parallel G-C subcircuit of an electrical circuit representation of said cell or battery containing a plurality of said G-C subcircuits; and, determining the value of said absolute stored charge from the value of said capacitance element.

95. A method for determining an exchange current of an electrochemical cell or battery comprising:
  sensing time-varying electrical response to time-varying electrical excitation of said cell or battery;
  processing said time-varying electrical response to evaluate the conductance element of a particular parallel G-C subcircuit of an electrical circuit representation of said cell or battery; and,
  determining the value of said exchange current from the value of said conductance element.

96. A method for determining the state-of-charge of an electrochemical cell or battery comprising:
  sensing time-varying electrical response to time-varying electrical excitation of said cell or battery;
  processing said time-varying electrical response to evaluate the capacitance element of a particular parallel G-C subcircuit and the conductance element of a different parallel G-C subcircuit of an electrical circuit representation of said cell or battery; and,
  determining the value of said state-of-charge from the value of said capacitance element and the value of said conductance element.

97. A method for determining the total storage capacity of an electrochemical cell or battery comprising:
  sensing time-varying electrical response to time-varying electrical excitation of said cell or battery;
  processing said time-varying electrical response to evaluate the capacitance element of a particular parallel G-C subcircuit and the conductance element of a different parallel G-C subcircuit of an electrical circuit representation of said cell or battery; and,
  determining the value of said total storage capacity from the value of said capacitance element and the value of said conductance element.

98. A method for determining the maximum exchange current of an electrochemical cell or battery comprising:
  sensing time-varying electrical response to time-varying electrical excitation of said cell or battery;
  processing said time-varying electrical response to evaluate the capacitance element of a particular parallel G-C subcircuit and the conductance element of a different parallel G-C subcircuit of an electrical circuit representation of said cell or battery; and,
  determining the value of said maximum exchange current from the value of said capacitance element and the value of said conductance element.

99. A method for determining the absolute cranking current of an electrochemical cell or battery comprising:
  sensing time-varying electrical response to time-varying electrical excitation of said cell or battery;
  processing said time-varying electrical response to evaluate the resistance element of a series R-L subcircuit of an electrical circuit representation of said cell or battery; and,
  determining the value of said absolute cranking current from the value of said resistance element.

100. The method according to claim 99 further applied to determining fully charged cranking current including:
  processing said time-varying electrical response to evaluate the capacitance element of a particular parallel G-C subcircuit and the conductance element of a different parallel G-C subcircuit of said electrical circuit representation of said cell or battery; and,
  correcting said absolute cranking current with a correction factor evaluated in accordance with values of said capacitance element and said conductance element to obtain said fully charged cranking current.

101. The method of claim 100 further applied to determining state-of-health including:
  inputting a battery rating; and,
  comparing said fully charged cranking current with a reference number in accordance with said battery rating to determine said state-of-health.

102. The method of claim 101 wherein said battery rating is a cold cranking ampere battery rating.

103. The method of claim 97 further applied to determining state-of-health including:
  inputting a battery rating; and,
  comparing said total storage capacity with a reference number in accordance with said battery rating to determine said state-of-health.

104. The method of claim 103 wherein said battery rating is an ampere-hour battery rating.

105. The method of claim 103 wherein said battery rating is a reserve capacity battery rating.

106. A method for determining a double layer capacitance of an electrochemical cell or battery comprising:
  sensing time-varying electrical response to time-varying electrical excitation of said cell or battery;
  processing said time-varying electrical response to evaluate the capacitance element of a particular parallel G-C subcircuit of an electrical circuit representation of said cell or battery containing a plurality of said G-C subcircuits; and,
  determining the value of said double layer capacitance from the value of said capacitance element.

107. A method for determining a charge transfer conductance of an electrochemical cell or battery comprising:
  sensing time-varying electrical response to time-varying electrical excitation of said cell or battery;
  processing said time-varying electrical response to evaluate the conductance element of a particular parallel G-C subcircuit of an electrical circuit representation of said cell or battery; and,
  determining the value of said charge transfer conductance from the value of said conductance element.

108. A method for determining a maximum double layer capacitance of an electrochemical cell or battery comprising:
  sensing time-varying electrical response to time-varying electrical excitation of said cell or battery;
  processing said time-varying electrical response to evaluate the capacitance element of a particular parallel G-C subcircuit and the conductance element of a different parallel G-C subcircuit of an electrical circuit representation of said cell or battery; and,
  determining the value of said maximum double layer capacitance from the value of said capacitance element and the value of said conductance element.

109. A method for determining a maximum charge transfer conductance of an electrochemical cell or battery comprising:
  sensing time-varying electrical response to time-varying electrical excitation of said cell or battery;
  processing said time-varying electrical response to evaluate the capacitance element of a particular parallel G-C subcircuit and the conductance element of a different parallel G-C subcircuit of an electrical circuit representation of said cell or battery; and,
  determining the value of said maximum charge transfer conductance from the value of said capacitance element and the value of said conductance element.

110. Apparatus for determining the absolute stored charge of an electrochemical cell or battery adapted to perform the method according to claim 94.

111. Apparatus for determining an exchange current of an electrochemical cell or battery adapted to perform the method according to claim 95.

112. Apparatus for determining state-of-charge of an electrochemical cell or battery adapted to perform the method according to claim 96.

113. Apparatus for determining the total storage capacity of an electrochemical cell or battery adapted to perform the method according to claim 97.

114. Apparatus for determining the maximum exchange current of an electrochemical cell or battery adapted to perform the method according to claim 98.

115. Apparatus for determining the absolute cranking current of an electrochemical cell or battery adapted to perform the method according to claim 99.

116. Apparatus for determining fully charged cranking current of an electrochemical cell or battery adapted to perform the method according to claim 100.

117. Apparatus for determining state-of-health of an electrochemical cell or battery adapted to perform the method according to claim 101.

118. Apparatus for determining state-of-health of an electrochemical cell or battery adapted to perform the method according to claim 103.

119. Apparatus for determining a double layer capacitance of an electrochemical cell or battery adapted to perform the method according to claim 106.

120. Apparatus for determining a charge transfer conductance of an electrochemical cell or battery adapted to perform the method according to claim 107.

121. Apparatus for determining a maximum double layer capacitance of an electrochemical cell or battery adapted to perform the method according to claim 108.

122. Apparatus for determining a maximum charge transfer conductance of an electrochemical cell or battery adapted to perform the method according to claim 109.

123. Apparatus for determining state-of-charge of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a charge transfer conductance and a double layer capacitance, said computation circuitry further adapted to determine said state-of-charge by combining values of said charge transfer conductance and said double layer capacitance.

124. A method for determining state-of-charge of an electrochemical cell or battery comprising:

sensing time-varying electrical response to time-varying electrical excitation of said cell or battery;

processing said time-varying electrical response to evaluate a double layer capacitance and a charge transfer conductance; and, determining said state-of-charge by combining values of said double layer capacitance and said charge transfer conductance.

125. Apparatus for determining state-of-charge of an electrochemical cell or battery adapted to perform the method according to claim 124.

126. Apparatus for determining total storage capacity of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a charge transfer conductance and a double layer capacitance, said computation circuitry further adapted to determine said total storage capacity by combining values of said charge transfer conductance and said double layer capacitance.

127. A method for determining total storage capacity of an electrochemical cell or battery comprising:

sensing time-varying electrical response to time-varying electrical excitation of said cell or battery;

processing said time-varying electrical response to evaluate a double layer capacitance and a charge transfer conductance; and, determining said total storage capacity by combining values of said double layer capacitance and said charge transfer conductance.

128. Apparatus for determining total storage capacity of an electrochemical cell or battery adapted to perform the method according to claim 127.

129. Apparatus for determining absolute stored charge of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a double layer capacitance, said computation circuitry further adapted to determine said absolute stored charge from the value of said double layer capacitance.

130. A method for determining absolute stored charge of an electrochemical cell or battery comprising:

sensing time-varying electrical response to time-varying electrical excitation of said cell or battery;

processing said time-varying electrical response to evaluate a double layer capacitance; and, determining said absolute stored charge from the value of said double layer capacitance.

131. Apparatus for determining absolute stored charge of an electrochemical cell or battery adapted to perform the method according to claim 130.

132. Apparatus for determining an exchange current of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a charge transfer conductance, said computation circuitry further adapted to determine said exchange current from the value of said charge transfer conductance.

133. A method for determining an exchange current of an electrochemical cell or battery comprising:

sensing time-varying electrical response to time-varying electrical excitation of said cell or battery;

processing said time-varying electrical response to evaluate a charge transfer conductance; and, determining said exchange current from the value of said charge transfer conductance.

134. Apparatus for determining an exchange current of an electrochemical cell or battery adapted to perform the method according to claim 133.

135. Apparatus for determining a maximum double layer capacitance of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a double layer capacitance and a charge transfer conductance, said computation circuitry further adapted to determine said maximum double layer capacitance from the values of said double layer capacitance and said charge transfer conductance.

136. A method for determining a maximum double layer capacitance of an electrochemical cell or battery comprising:

sensing time-varying electrical response to time-varying electrical excitation of said cell or battery;

processing said time-varying electrical response to evaluate a double layer capacitance and a charge transfer conductance; and, determining said maximum double layer capacitance from the values of said double layer capacitance and said charge transfer conductance.

137. Apparatus for determining a maximum double layer capacitance of an electrochemical cell or battery adapted to perform the method according to claim 136.

138. Apparatus for determining a maximum charge transfer conductance of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a double layer capacitance and a charge transfer conductance, said computation circuitry further adapted to determine said maximum charge transfer conductance from the values of said double layer capacitance and said charge transfer conductance.

139. A method for determining a maximum charge transfer conductance of an electrochemical cell or battery comprising:

sensing time-varying electrical response to time-varying electrical excitation of said cell or battery;

processing said time-varying electrical response to evaluate a double layer capacitance and a charge transfer conductance; and, determining said maximum charge transfer conductance from the values of said double layer capacitance and said charge transfer conductance.

140. Apparatus for determining a maximum charge transfer conductance of an electrochemical cell or battery adapted to perform the method according to claim 139.

141. Apparatus for determining a maximum exchange current of an electrochemical cell or battery comprising:

response sensing circuitry coupled to said cell or battery and adapted to sense time-varying electrical response of said cell or battery generated as a result of time-varying electrical excitation of said cell or battery; and, computation circuitry responsive to said time-varying response and adapted to evaluate a double layer capacitance and a charge transfer conductance, said computation circuitry further adapted to determine said maximum exchange current from the values of said double layer capacitance and said charge transfer conductance.

142. A method for determining a maximum exchange current of an electrochemical cell or battery comprising:

sensing time-varying electrical response to time-varying electrical excitation of said cell or battery;

processing said time-varying electrical response to evaluate a double layer capacitance and a charge transfer conductance; and, determining said maximum exchange current from the values of said double layer capacitance and said charge transfer conductance.

143. Apparatus for determining a maximum exchange current of an electrochemical cell or battery adapted to perform the method according to claim 142.

* * * * *

UNITED STATES PATENT AND TRADEMARK OFFICE
CERTIFICATE OF CORRECTION

PATENT NO. : 6,737,831 B2
DATED : May 18, 2004
INVENTOR(S) : Keith S. Champlin

It is certified that error appears in the above-identified patent and that said Letters Patent is hereby corrected as shown below:

Column 7,
Line 45, equation (4), delete equation and insert:

-- $G3 = 4 \cdot G3_{max} \cdot (N^-_{Pb}/N^-) \cdot (N^-_{PbSO_4}/N^-)$ --.

Line 46, delete "$N^- = N^-_{Pb} + N^{4-}_{PbSO}$" and insert -- $N^- = N^-_{Pb} + N^-_{PbSO_4}$ --.

Line 48, delete "$N_{PbSO}{}^{4-}$" and insert -- $N^-_{PbSO_4}$ --.

Line 50, delete "$N^-_{Pb} = N^{4-}_{PbSO} = N^-/2$" and insert -- $N^-_{Pb} = N^-_{PbSO_4} = N^-/2$ --.

Line 55, equation (5), delete equation and insert:

-- $SOC = (N^-_{Pb}/N^-) = 1 - (N^-_{PbSO_4}/N^-)$ --.

Column 8,
Line 56, equation (12), delete "$^i0_{max}$" and insert -- $i_{0max}$ --.

Signed and Sealed this

Seventh Day of December, 2004

JON W. DUDAS
*Director of the United States Patent and Trademark Office*